(12) United States Patent
Spiro

(10) Patent No.: US 10,716,229 B2
(45) Date of Patent: Jul. 14, 2020

(54) WIREPORT ASSEMBLY

(71) Applicant: Daniel S. Spiro, Paradise Valley, AZ (US)

(72) Inventor: Daniel S. Spiro, Paradise Valley, AZ (US)

( * ) Notice: Subject to any disclaimer, the term of this patent is extended or adjusted under 35 U.S.C. 154(b) by 0 days.

(21) Appl. No.: 16/191,937

(22) Filed: Nov. 15, 2018

(65) Prior Publication Data
US 2019/0090371 A1 Mar. 21, 2019

Related U.S. Application Data

(62) Division of application No. 15/694,560, filed on Sep. 1, 2017, now Pat. No. 10,292,289.

(51) Int. Cl.
*B05B 15/62* (2018.01)
*F21V 23/00* (2015.01)
(Continued)

(52) U.S. Cl.
CPC ........... *H05K 5/0256* (2013.01); *B05B 15/62* (2018.02); *F21S 4/10* (2016.01); *F21S 8/068* (2013.01); *F21V 23/001* (2013.01); *G05B 15/02* (2013.01); *G06N 5/02* (2013.01); *H01R 13/73* (2013.01); *H01R 33/05* (2013.01); *H01R 33/88* (2013.01);
(Continued)

(58) Field of Classification Search
CPC .. B05B 15/62; B05B 9/04; E04F 15/02; E04F 15/024; E04F 15/08; E04F 15/02016; E04F 15/02429; E04F 15/02447; E04F 15/02494; F21S 4/10; F21S 8/068; F21V 23/001; F21V 23/00; G05B 15/02; G06N 5/02; H01R 13/73; H01R 13/005; H01R 33/945; H01R 33/05; H01R 33/88; H01R 33/90; H02G 15/02; H02G 15/08; H04B 1/38; H05K 5/0256; H05K 5/02
USPC ............ 361/729; 174/75 R; 52/126.6, 220.3, 52/220.7
See application file for complete search history.

(56) References Cited

U.S. PATENT DOCUMENTS 4,915,639 A * 4/1990 Cohn ................. G06K 7/10861
307/116
5,205,091 A 4/1993 Brown
(Continued)

FOREIGN PATENT DOCUMENTS

CN 204720148 10/2015
CN 105407547 3/2016
(Continued)

OTHER PUBLICATIONS

Ravichandran, S., Intelligent Public Lighting System, International Science Press, 2016, pp. 201-204.
(Continued)

*Primary Examiner* — Timothy J Thompson
*Assistant Examiner* — Guillermo J Egoavil
(74) *Attorney, Agent, or Firm* — Schmeiser, Olsen & Watts LLP

(57) ABSTRACT

An electrified wire containing a plurality of integrated hubs populated along the wire's span providing mechanical and electrical and data connectivity to an array of removable device platforms with IoT device assemblies whereas the devices assemblies operate in real time, are either networked or stand-alone, and can be placed where and when needed.

6 Claims, 10 Drawing Sheets

(51) Int. Cl.
| | |
|---|---|
| G05B 15/02 | (2006.01) |
| H01R 13/73 | (2006.01) |
| H01R 33/05 | (2006.01) |
| H01R 33/88 | (2006.01) |
| H01R 33/90 | (2006.01) |
| H05K 5/02 | (2006.01) |
| G06N 5/02 | (2006.01) |
| F21S 4/10 | (2016.01) |
| F21S 8/06 | (2006.01) |
| H04B 1/38 | (2015.01) |
| B05B 9/04 | (2006.01) |
| H01R 33/945 | (2006.01) |
| H01R 13/00 | (2006.01) |

(52) U.S. Cl.
CPC ............... *H01R 33/90* (2013.01); *B05B 9/04* (2013.01); *H01R 13/005* (2013.01); *H01R 33/945* (2013.01); *H04B 1/38* (2013.01)

(56) References Cited

U.S. PATENT DOCUMENTS

| | | | |
|---|---|---|---|
| 6,908,324 B1* | 6/2005 | Morley | G06F 1/1632 |
| | | | 439/11 |
| 9,513,648 B2 | 12/2016 | Forbes, Jr. | |
| 9,544,976 B2 | 1/2017 | Snyder et al. | |
| 9,615,066 B1 | 4/2017 | Tran et al. | |
| 9,671,072 B1 | 6/2017 | May | |
| 9,699,836 B2 | 6/2017 | Bahrehmand | |
| 10,378,741 B2* | 8/2019 | Borgeson | F21V 23/001 |
| 2008/0094423 A1 | 4/2008 | Summerland | |
| 2010/0124059 A1 | 5/2010 | Duffy et al. | |
| 2010/0195332 A1* | 8/2010 | Wasem | F21S 2/00 |
| | | | 362/249.16 |
| 2010/0262297 A1 | 10/2010 | Shloush et al. | |
| 2011/0010019 A1 | 1/2011 | Shloush et al. | |
| 2013/0058065 A1* | 3/2013 | Minaguchi | H04N 5/64 |
| | | | 361/807 |
| 2013/0095710 A1* | 4/2013 | Townsend, Jr. | F21S 8/068 |
| | | | 439/888 |
| 2013/0163231 A1 | 6/2013 | Chen | |
| 2014/0125131 A1 | 5/2014 | Lalitnuntikul et al. | |
| 2015/0008829 A1 | 1/2015 | Lurie et al. | |
| 2015/0198941 A1* | 7/2015 | Pederson | G06F 3/013 |
| | | | 700/275 |
| 2015/0373796 A1 | 12/2015 | Bahrehmand | |
| 2016/0072638 A1 | 3/2016 | Amer et al. | |
| 2016/0110782 A1 | 4/2016 | Tadajewski | |
| 2016/0195856 A1* | 7/2016 | Spero | G06N 5/046 |
| | | | 700/90 |
| 2016/0252487 A1* | 9/2016 | Bhide | G01K 1/14 |
| | | | 702/50 |
| 2017/0027045 A1 | 1/2017 | Chemel | |
| 2017/0099353 A1 | 4/2017 | Arora et al. | |
| 2017/0227204 A1 | 8/2017 | May | |
| 2019/0075671 A1* | 3/2019 | Spiro | H05K 5/0256 |

FOREIGN PATENT DOCUMENTS

| | | |
|---|---|---|
| CN | 105471724 | 4/2016 |
| CN | 205336611 | 6/2016 |
| CN | 205754988 | 11/2016 |
| DE | 102006022640 | 11/2007 |
| WO | 2009012231 | 1/2009 |
| WO | 2016118022 | 7/2016 |
| WO | 2017120219 | 7/2017 |

OTHER PUBLICATIONS

Salisbury, Jon, Internet of Things—Smart Home Explained, blog post, Sep. 27, 2016, https://nexigen.com/blog/2016/09/27/internet-of-things-smart-home-explained/, 5 pages.

Alsheikh et al., Machine Learning in Wireless Sensor Networks: Algorithms, Strategies, and Applications, School of Computer Engineering, Nanyang Technological University, Singapore, Sense and Sense-abilities Programme, Institute for Infocomm Research, Singapore, 23 pages.

Blackstock et al., IoT Interoperability: A Hub-Based Approach, 2014 International Conference on the Internet of Things (IOT), Oct. 6, 2014-Oct. 8, 2014, Cambridge, MA.

* cited by examiner

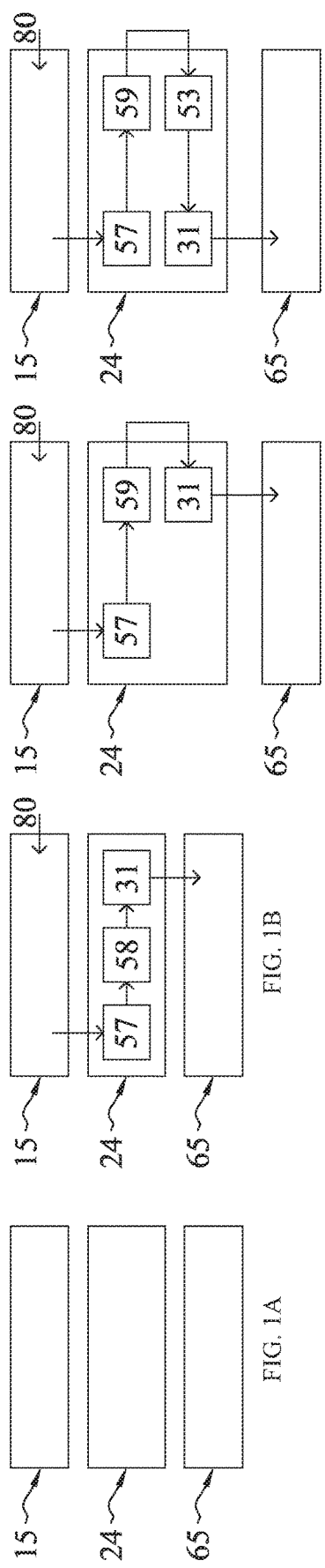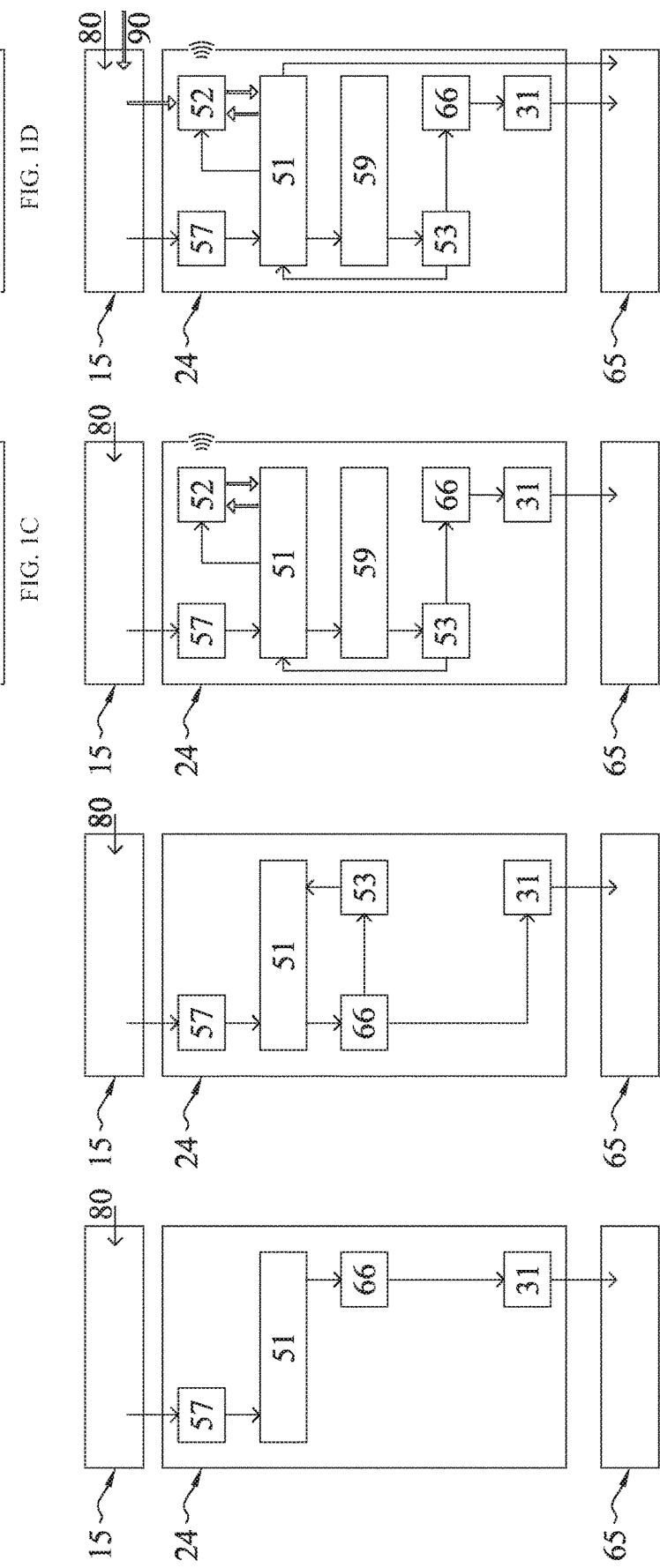

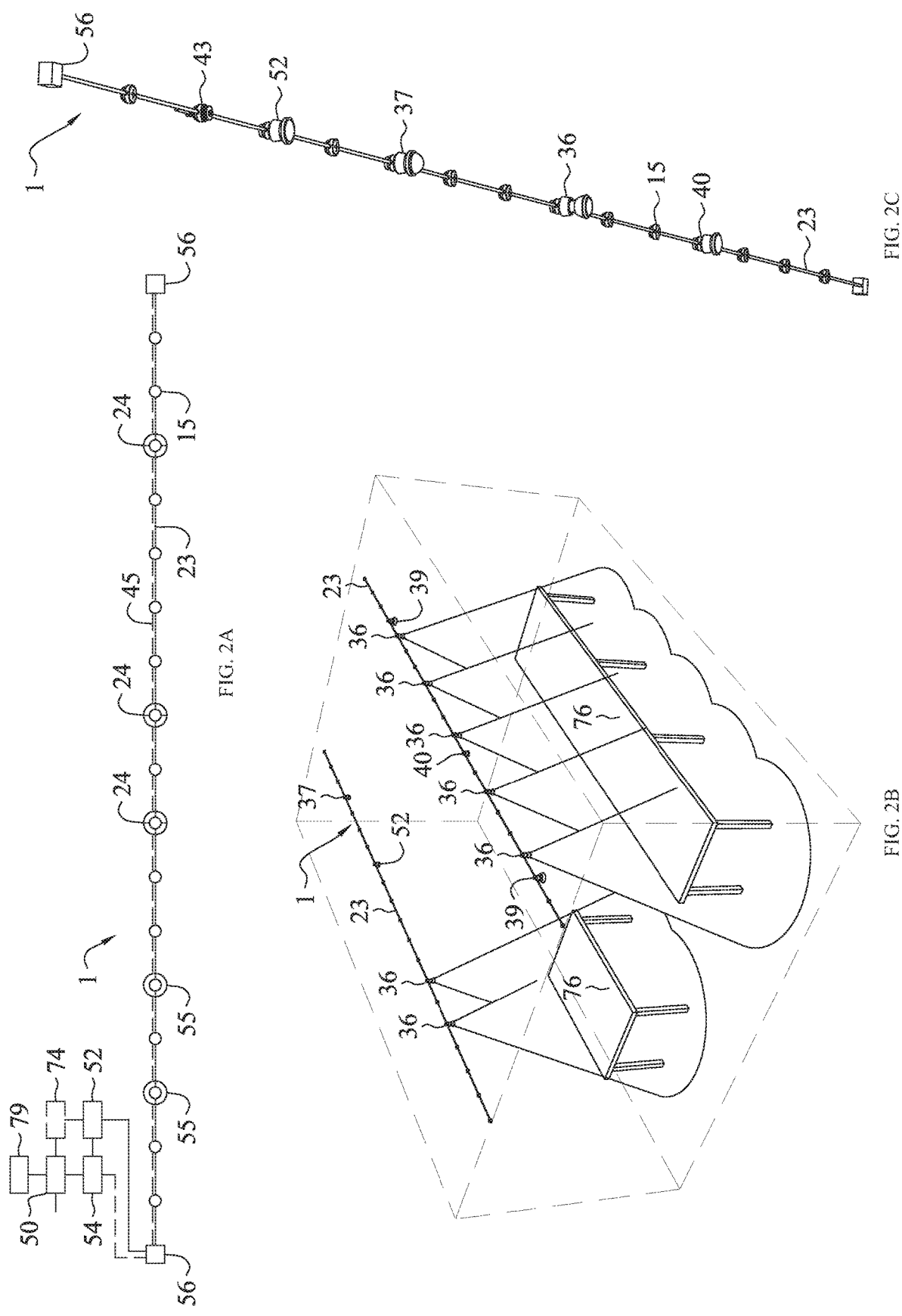

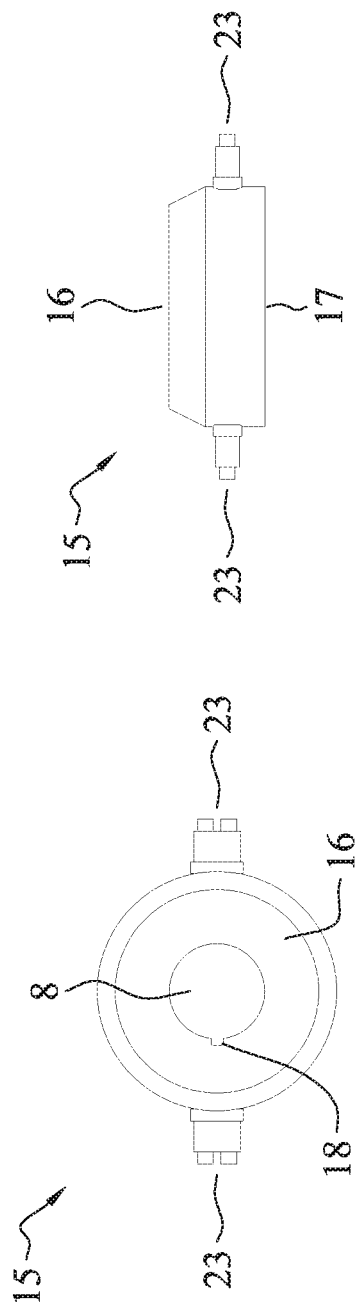
FIG. 3A
FIG. 3B
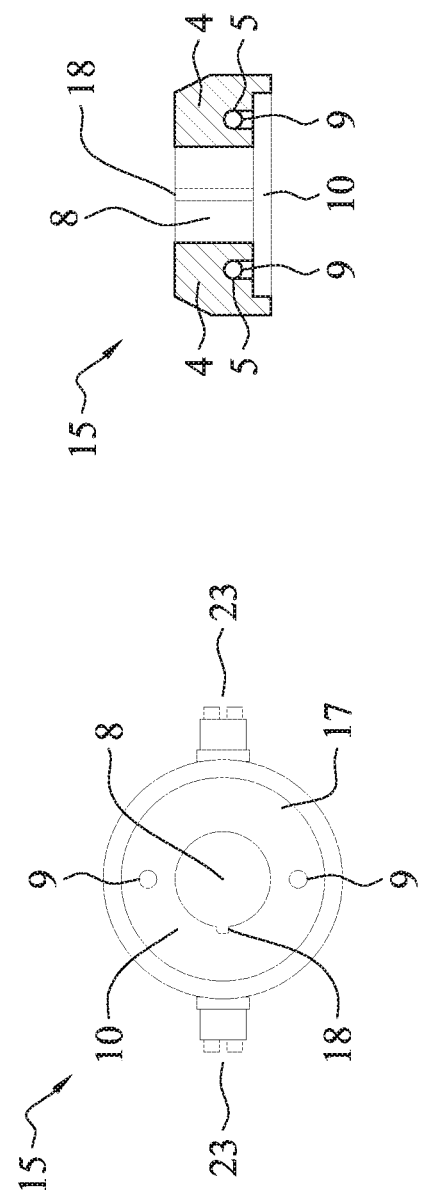
FIG. 3C
FIG. 3D

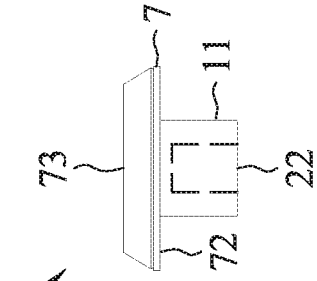
FIG. 4A
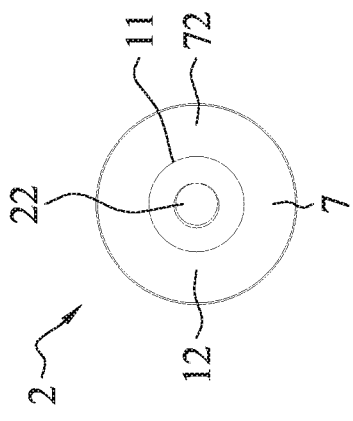
FIG. 4B
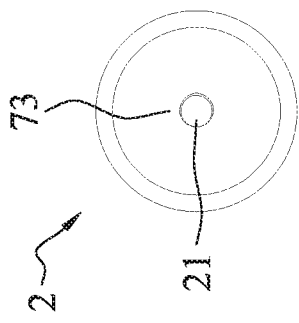
FIG. 4C
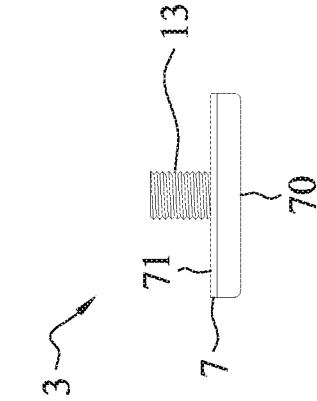
FIG. 4D
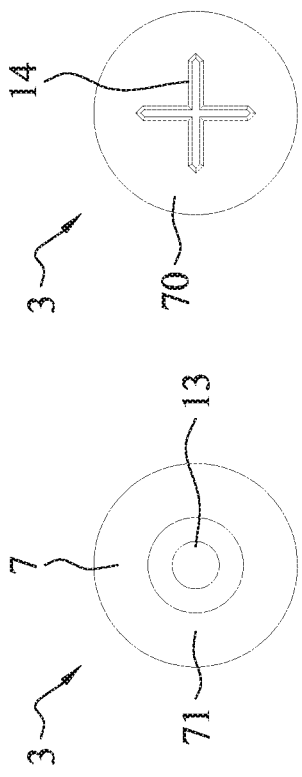
FIG. 4E
FIG. 4F

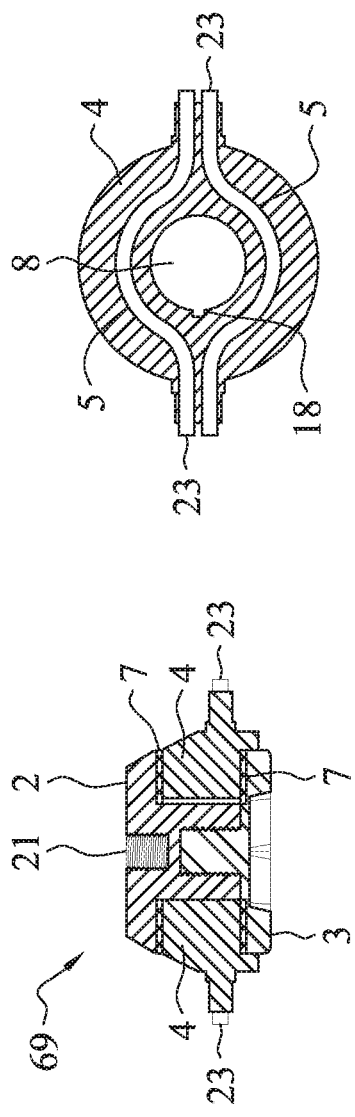
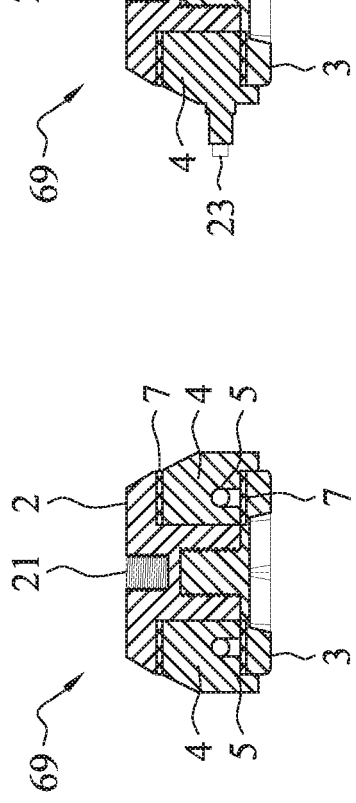
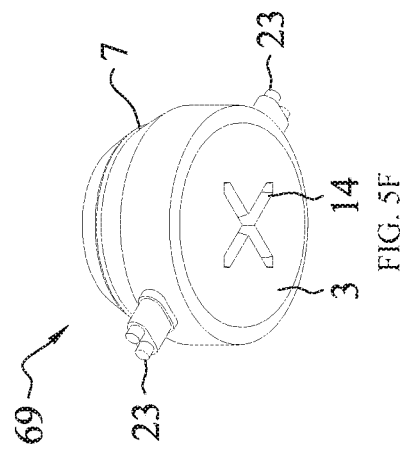
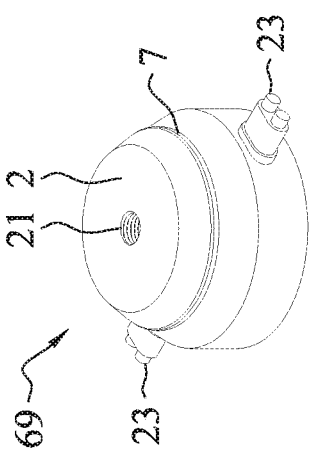
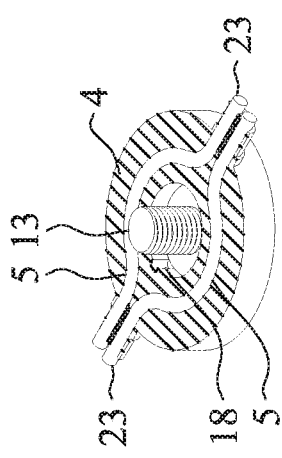

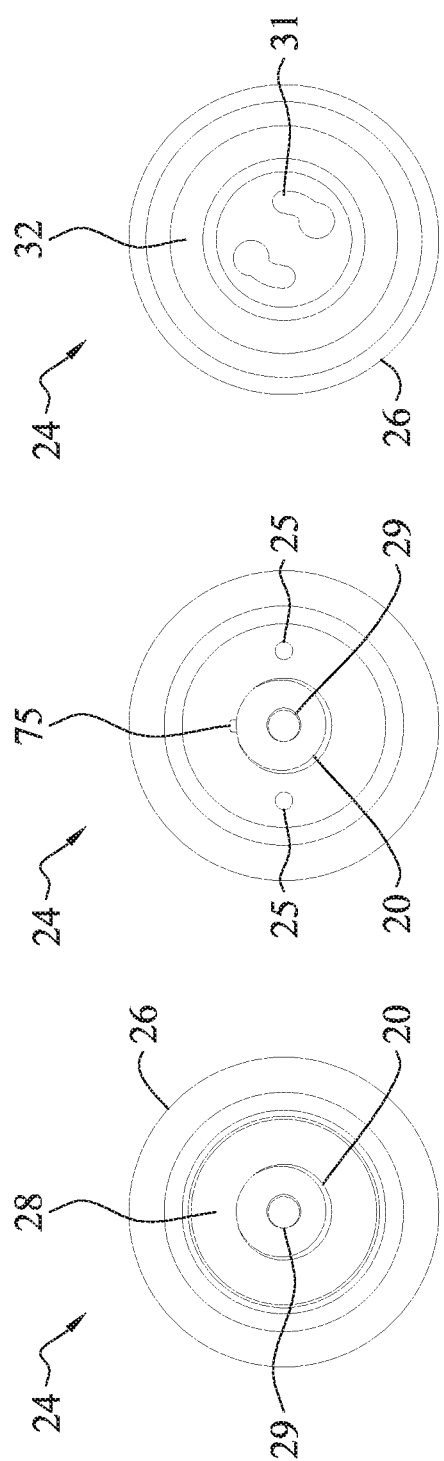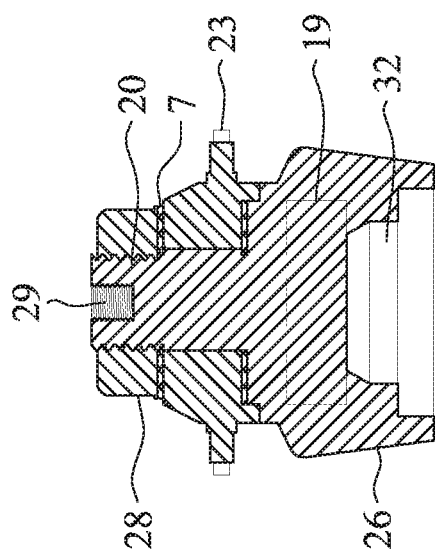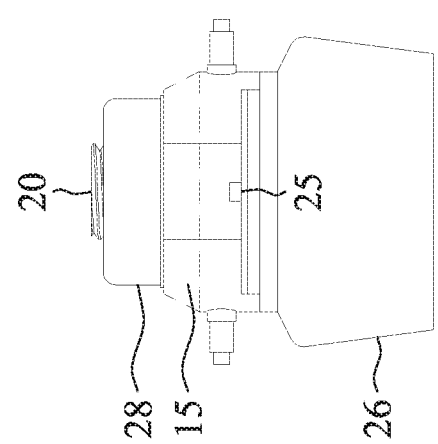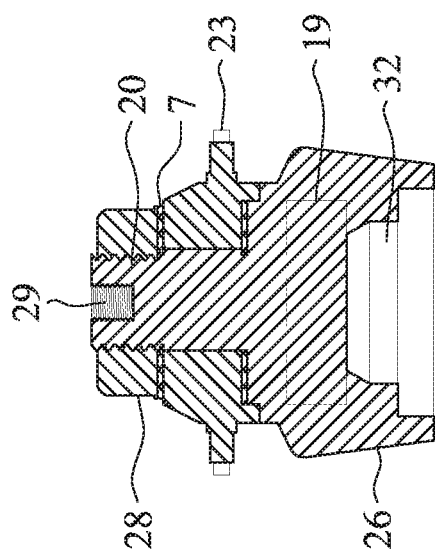

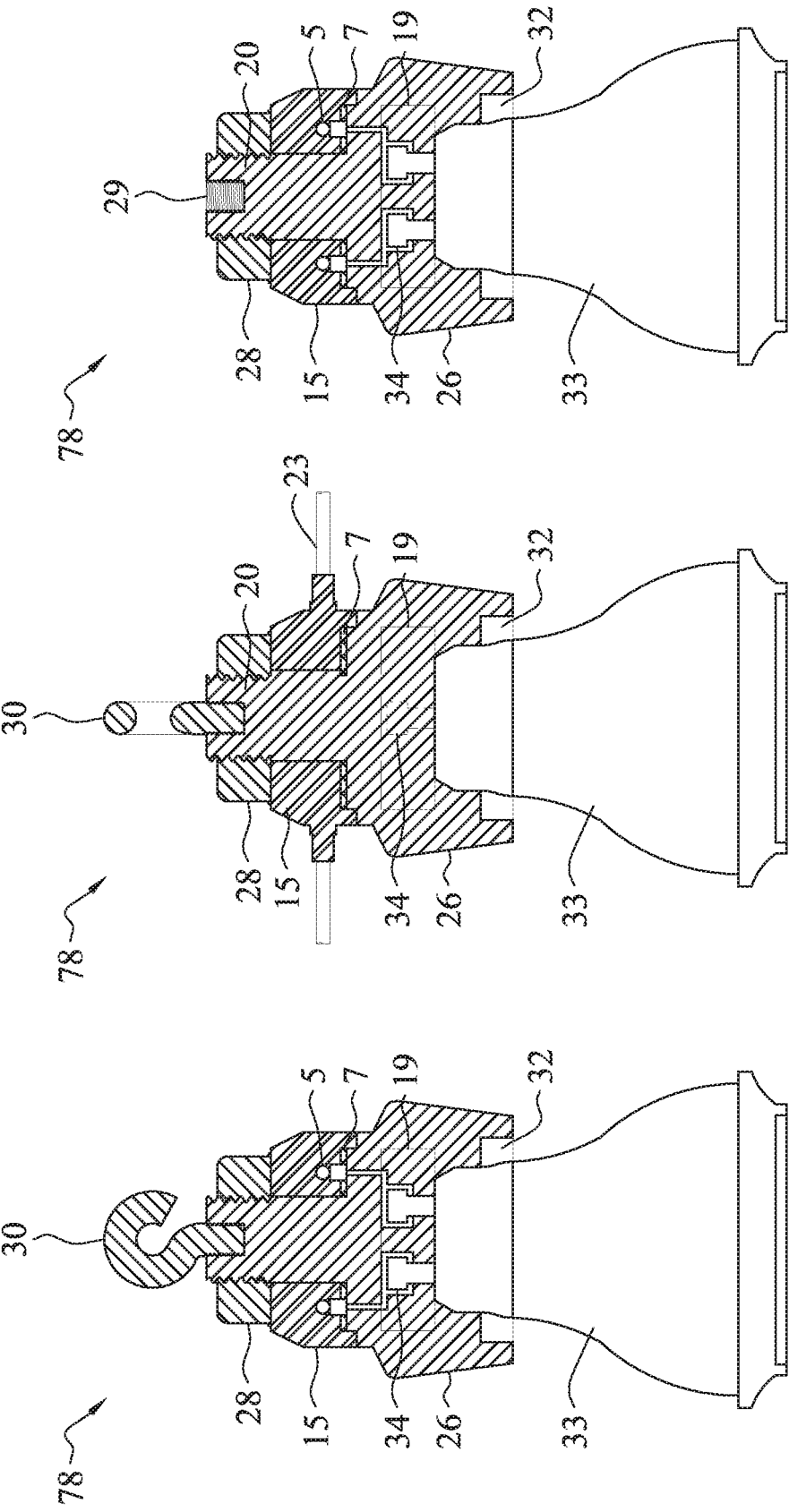

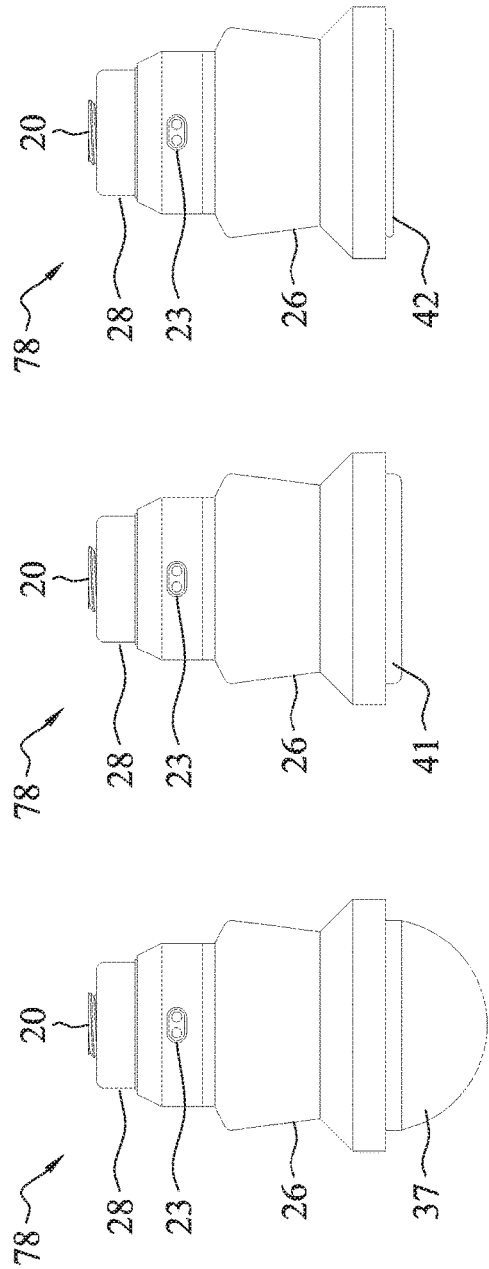
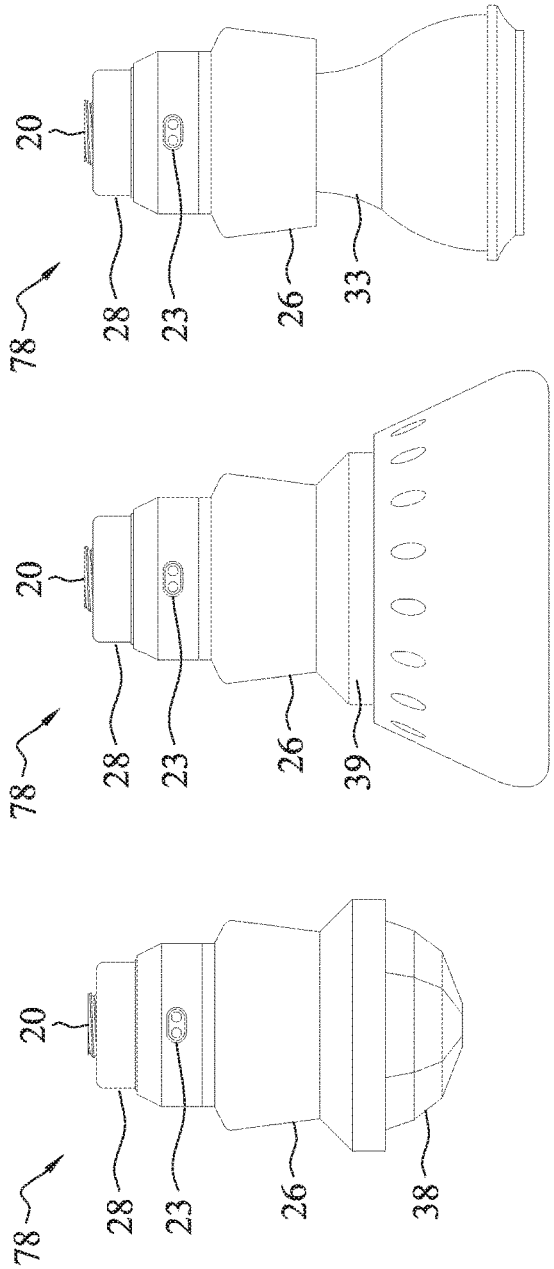

WIREPORT ASSEMBLY

CROSS REFERENCE TO RELATED APPLICATION[S]

This application is a divisional of the earlier U.S. Utility patent application Ser. No. 15/694,560, entitled "WIREPORT ASSEMBLY," filed Sep. 1, 2017, the disclosure of which is hereby incorporated entirely herein by reference.

BACKGROUND OF THE INVENTION

Technical Field

This invention relates generally to a wired device and more particularly to a modular wireport assembly.

State of the Art

The commonly available "string light" is limited to an array of lamps either embedded inside a protective translucent coating or mounted to the exterior of the "string light" wire. The "string light" lamps are factory pre-set at repeated intervals along the electrified wire length. External mounted lamps may employ lamp holders. The lamps holders are either integrated with the "string light" electrified wire or suspended below. Lamps and lamp holders suspended below the "string light" electrified wire employ a drop cord. The cord may be integrated with the electrified wire or plugged in.

The commonly available "string light" electrified wire and lamp assembly design was conceived for illumination purposes barring the inclusion of other devices. The wireport innovation is an inclusionary electrified wire device platform employing an array of IOT devices including lighting. The devices are selectively placed along the span of electrified wire, providing 24/7 comfort and safety utility.

SUMMARY OF THE INVENTION

An embodiment includes a wireport assembly comprising: a linear conductor; a plurality of devices; and a plurality of hubs integrated with the linear conductor along the length of the linear conductor, wherein each device of the plurality of devices is directly mounted to a hub of the plurality of hubs or indirectly mounted to the hub with a device platform, wherein the plurality of hubs are configured to provide mechanical connectivity, mechanical and electrical connectivity, or mechanical, electrical and data connectivity between the linear conductor and the plurality of devices.

Another embodiment includes a removable device platform comprising: a mechanical receptacle adapted to mechanically connect to a device and a hub, the hub integrated with a linear conductor, the mechanical receptacle to convey power or power and data from the linear conductor to the device; and at least one of a hub power receptacle, a device power receptacle, a wireless transceiver, a back-up power unit, a processor, a micro-switch, a spray nozzle, and a power supply/modulation unit.

Yet another embodiment includes a hub comprising: a mechanical receptacle; an electrical receptacle; and a data receptacle, wherein the hub is integrated into a prime conductor wire the receptacles providing mechanical connectivity, mechanical and electrical connectivity or mechanical, electrical and data connectivity to a device mounted to the hub.

The foregoing and other features and advantages of the present invention will be apparent from the following more detailed description of the particular embodiments of the invention, as illustrated in the accompanying drawings.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 1A is a diagrammatic view of a non-powered assembly of a wireport device according to an embodiment;

FIG. 1B is a diagrammatic view of an assembly with direct power of a wireport device according to an embodiment;

FIG. 1C is a diagrammatic view of an assembly with power supply/modulator of a wireport device according to an embodiment;

FIG. 1D is a diagrammatic view of an assembly with power supply/modulator and back-up power of a wireport device according to an embodiment;

FIG. 1E is a diagrammatic view of an assembly with a processor with a micro-switch of a wireport device according to an embodiment;

FIG. 1F is a diagrammatic view of an assembly with a micro-processor, a micro-switch and back-up power of a wireport device according to an embodiment;

FIG. 1G is a diagrammatic view of an assembly with a wireless transceiver, a micro-processor, a micro-switch, back-up power and a power management/modulation unit of a wireport device according to an embodiment;

FIG. 1H is a diagrammatic view of a powered assembly having a wired and wireless transceiver, a processor, a micro-switch, a back-up power device, and a power management/modulation unit of a wireport device according to an embodiment;

FIG. 2A is a diagrammatic view of a wireport assembly according to an embodiment;

FIG. 2B is a top perspective view of an exterior wireport assembly according to an embodiment;

FIG. 2C is a perspective view of a wireport assembly according to an embodiment;

FIG. 3A is a top view of a hub according to an embodiment;

FIG. 3B is a side view of a hub according to an embodiment;

FIG. 3C is a bottom view of a hub according to an embodiment;

FIG. 3D is a section view of a hub according to an embodiment;

FIG. 4A is top view of a top cap of a hub according to an embodiment;

FIG. 4B is a bottom view of a top cap of a hub according to an embodiment;

FIG. 4C is a side view of a top cap of a hub according to an embodiment;

FIG. 4D is a top view of a bottom cap of a hub according to an embodiment;

FIG. 4E is a bottom view of a bottom cap of a hub according to an embodiment;

FIG. 4F is a side view of a bottom cap of a hub according to an embodiment;

FIG. 5A is a vertical section perpendicular to primary conductors of a wireport assembly according to an embodiment;

FIG. 5B is a vertical section parallel to primary conductors of a wireport assembly according to an embodiment;

FIG. 5C is a horizontal section at hub conductors of a wireport assembly according to an embodiment;

FIG. 5D is a vertical section perspective view of a wireport assembly according to an embodiment;

FIG. 5E is a top perspective view of a wireport assembly according to an embodiment;

FIG. 5F is a bottom perspective view of a wireport assembly according to an embodiment;

FIG. 6A is a top view of a device platform with a nut according to an embodiment;

FIG. 6B is a top view of a device platform with a nut according to an embodiment;

FIG. 6C is a bottom view of a device platform with a nut according to an embodiment;

FIG. 6D is a side view of a device platform with a nut according to an embodiment;

FIG. 6E is a side view of a device platform with a nut rotated at 90° according to an embodiment;

FIG. 6F is a section view parallel to primary conductors of a device platform with a nut rotated at 90° according to an embodiment;

FIG. 8A is a section view perpendicular to primary conductors of a wireport assembly with a lamp according to an embodiment;

FIG. 8B is a section view parallel to primary conductors of a wireport assembly with a lamp according to an embodiment;

FIG. 8C a section view perpendicular to primary conductors of a wireport assembly with a lamp according to an embodiment;

FIG. 9A is a side elevation of a wireport assembly with a camera according to an embodiment;

FIG. 9B is a side elevation of a wireport assembly with a wireless transceiver according to an embodiment;

FIG. 9C is a side elevation of a wireport assembly with a speaker/mic according to an embodiment;

FIG. 9D is a side elevation of a wireport assembly with a photocell/occupancy sensor according to an embodiment;

FIG. 9E is a side elevation of a wireport assembly with a fan according to an embodiment;

FIG. 9F is a side elevation of a wireport assembly with a lamp according to an embodiment;

LIST OF ELEMENTS IDENTIFIED IN THE DRAWINGS

Figure 7B:
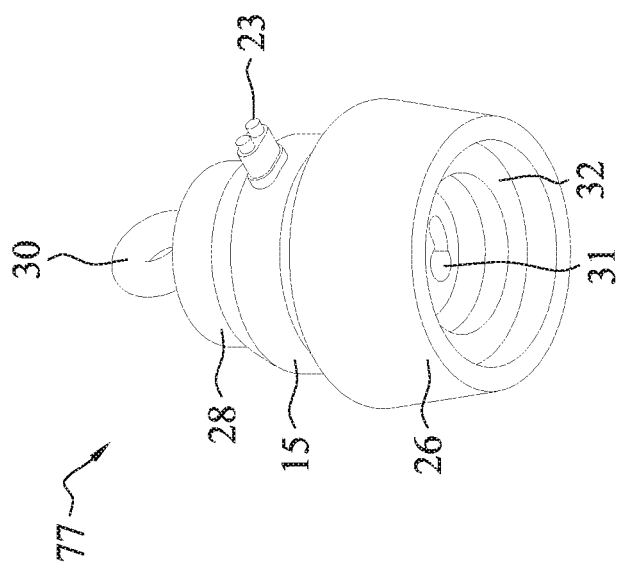
FIG. 7B is a bottom perspective view of a device assembly according to an embodiment.

1. Wireport assembly
2. Top cap
3. Bottom cap
4. Hub insulated walls
5. Hub conductor/s
6. Device platform electrical contact/s
7. Gasket
8. Hub through opening
9. Hub electrical contact guide
10. Hub bottom gasket cavity
11. Top cap stem
12. Top cap contact surface with hub
13. Bottom cap threaded stem
14. Bottom cap screw recess
15. Hub
16. Hub top
17. Hub bottom
18. Hub guide groove
19. Device platform's internal device/s
20. Device platform threaded stem
21. Top cap threaded bore bore
22. Top cap stem threaded bore
23. Primary conductor/s
24. Device platform
25. Device platform contact leads
26. Device platform's exterior surface
27. Stem guide
28. Nut
29. Threaded stem with threaded top bore
30. Cable hanging loop
31. Device platform receptacle
32. Device platform bottom opening
33. Lamp
34. Lamp electrical contact
35. I loop hanger
36. Luminaire assembly
37. Camera assembly
38. Occupancy sensor/photocell assembly
39. Fan assembly
40. Speaker/microphone assembly
41. Air quality/temperature sensor assembly
42. Wireless transceiver assembly
43. Mister assembly
44. Cable
45. Pipe extender
46. Coupling
47. Spray nozzle
48. Mister hanger
49. Threaded pipe coupling
50. Power supply
51. Micro-processor
52. Transceiver
53. Device platform optional back-up power module
54. Mister fluid reservoir/pump
55. Wireport wire suspended device
56. Suspension hook/clamp/fastener
57. Device platform hub's power receptacle
58. Device platform's through conductors
59. Device platform's power management unit
60. Device platform's micro-processor
61. Device platform's micro-switch
62. Hub's power and data conductors
63. Device platform's power and data hub receptacle
64. Power management module
65. Electrified or non-electrified device
66. Micro-switch
67. Spray nozzle coupling
68. Mister body "T"
69. Hub and caps assembly
70. Bottom cap bottom surface
71. Bottom cap top surface
72. Top cap bottom surface
73. Top cap top surface
74. Master processor/controller
75. Device platform stem guide
76. Table
77. Device platform and hub assembly
78. Device platform, hub and device assembly 79. Back-up power supply
80. Power input
90. Data input/output

DETAILED DESCRIPTION OF EMBODIMENTS OF THE INVENTION

As discussed above, embodiments of the present invention relate to a wireport assembly generally including an electrified wire or other linear conductor containing a plurality of integrated hubs located along the wire's span providing mechanical and electrical and data connectivity to a plurality of removable device platforms with device assemblies coupled thereto.

The wireport has two key elements, the hub and the device platform.

The hub—The hub has dual functionality: (1) transmits power from primary conductors through the device platform to devices populated along the span of the electrified wire, and (2) provides mechanical mounting points for device platforms or devices. The hub may also provide power and data connectivity. The hub's miniaturized scale reduces visual pollution while it enables device connectivity where and when needed. Located at repeated intervals along the span of the electrified wire, the pre-fabricated hub is an integral element of the electrified wire. The hub design allows for both low voltage and line voltage device operation.

The device platform—Located between the hub and a device, the device platform is a universal mechanical and electrical or electrical and data connector. Power from primary conductors flows through the hub to the device platform and then to a device. In applications having wired data connectivity, the device platform relays signals between the associated network member/s and the local device. The device platform can also be fitted with a wireless transceiver, a micro-processor that may have an electrical micro-switch and a discrete address, a back-up power unit, and a power management unit. The device platform top has electrical or electrical/data leads for mating with corresponding receptacles in the hub. At its bottom, the device platform has receptacle/s for mating with a device. On top of the device platform a threaded bolt placed through the opening in the hub is secured against the hub from the top with a nut. The bolt's top end may contain a threaded bore into which an I-loop is placed. In long span or when the aggregate weight of devices exceeds the wireport's wire mechanical support capacity, a cable threaded through the I loop supports the wireport wire assembly.

The utility of the hub and the device platform assembly also include non-electrified devices. These devices may directly connect to the hub mechanically or employ a device platform.

The device platform accessories can be factory installed or added where and when needed. As such, the device platform's architecture may be scalable to allow adapting the device platform to suit its intended device operational needs.

The wireport's innovation:
  a. Operates an array of same or different devices on the same wired span
  b. Adds or removes devices to the wired span as needed
  c. Places devices only where needed along the wire
  d. Improves occupant sense of comfort and security by operating devices in unison
  e. Supports the use of electrical and non-electrical devises
  f. Communicates with onboard wireport devices and remote devices
  g. Optimizes device and system operation by self-learning algorithms
  h. Permits light source change throughout the seasons
  i. Permits lamp light output modulation
  j. Permits individual device operation when needed The wireport device categories may include power, communication, processing, and sensory. The devices may be electrified and non-electrified. All or some of its devices may be addressable having a unique address.

The wireport's assembly power devices may include step-down transformer, back-up power supply, power distribution module, power transmission conductors, and a myriad of devices.

The wireport's assembly communication devices communicate in real time with local and local-and-remote network devices unless programmed otherwise. The communication devices can be wired, wireless, or a combination of both methods. The devices' method of communication may include RF, optical, a combination of both, and any other combination in conjunction with other methods having open or encrypted communication protocols. The devices may include transceivers, input only, output only, or a combination thereof. The communication devices may be mounted inside the hub, the hub device platform and/or the device. The placement of any one communication module can be anywhere along the length of the electrified wire and/or in remote location.

The processing device may interact with a limited number or all of the wireport devices. The devices may all be mounted to the wireport wire hub or only to some, where others may be in the vicinity and/or remote location(s). The individual devices and/or the central processor may employ AI algorithms with self-learning capability. The wireport network of devices can be factory pre-programmed and/or receive updates periodically. The devices can be programmed to operate alone, in grouping of same functionality and/or in concert with other devices of a dissimilar functionality. The wireport innovation delivers 24/7 utility by integrating a myriad of devices on a common platform.

The sensory devices may include light source(s), fan, occupancy sensor, speaker, microphone, air quality sensor, projection pod, mister, and camera supported by analytics. The deployment of the wireport device array in concert multiplies the utility of the individual devices, all for lesser material, labor, and cost demands. Table 1 shows the expanded platform utility when dissimilar devices are operated in concert.

TABLE 1

| | Device | | | | | | | | |
|---|---|---|---|---|---|---|---|---|---|
| | Lamp | Speaker/Mic | Transceiver | Occupancy Sensor | Fan | Air Quality Sensor | Mister | Camera | Sound Canceler |
| Comfort | ○ | ○ | ○ | ○ | ○ | ○ | ○ | ○ | ○ |
| Security | ○ | ○ | ○ | ○ | — | ○ | — | ○ | — |

The wireport's broad utility provides a new method to observe and control the exterior building environment, enhancing occupants' comfort as well as security.

FIGS. 1a, 1b, 1c, 1d, 1e, 1f, 1g and 1h show several wireport system assembly 1 configurations.

FIG. 1a depicts a non-powered wireport assembly 1 including a hub 15, a device platform 24 and a device 65.

FIG. 1b depicts a powered wireport assembly 1 having direct power 80 to device 65, the assembly including a hub 15, a device platform 24 and a device 65. The device platform 24 may also include a power receptacle 57, conductors 58 and a device platform receptacle 31.

FIG. 1c depicts a powered wireport assembly 1 having power supply/modulator, the assembly including a hub 15, a device platform 24 and a device 65. The device platform 24 may also include a power receptacle 57, a power management unit 59 and a device platform receptacle 31, wherein power input 80 is supplied to the hub 15.

FIG. 1d depicts a powered wireport assembly 1 having power supply/modulator and back-up power device, the assembly including a hub 15, a device platform 24 and a device 65. The device platform 24 may also include a power receptacle 57, a power management unit 59, a back-up power module 53 and a device platform receptacle 31, wherein power input 80 is supplied to the hub 15.

FIG. 1e depicts a powered wireport assembly 1 having a processor with a micro-switch, the assembly including a hub 15, a device platform 24 and a device 65. The device platform 24 may also include a power receptacle 57, a micro-processor 51, a micro switch 66 and a device platform receptacle 31, wherein power input 80 is supplied to the hub 15.

FIG. 1f depicts a powered wireport assembly 1 having a processor with a micro-switch and back-up power, the assembly including a hub 15, a device platform 24 and a device 65. The device platform 24 may also include a power receptacle 57, a micro-processor 51, a micro switch 66, a back-up power module 53 and a device platform receptacle 31, wherein power input 80 is supplied to the hub 15.

FIG. 1g depicts a powered wireport assembly 1 having a wireless transceiver, a processor, a micro-switch, a back-up power device, and a power management/modulation unit, the assembly including a hub 15, a device platform 24 and a device 65. The device platform 24 may also include a power receptacle 57, a micro-processor 51, a transceiver 52, a power management unit 59, a micro switch 66, a back-up power module 53 and a device platform receptacle 31, wherein power input 80 is supplied to the hub 15. The transceiver 52 may communicate with the micro-processor 51 and wirelessly to remote devices.

FIG. 1h depicts a powered wireport assembly 1 having a wired and wireless transceiver, a processor, a micro-switch, a back-up power device, and a power management/modulation unit, the assembly including a hub 15, a device platform 24 and a device 65. The device platform 24 may also include a power receptacle 57, a micro-processor 51, a transceiver 52, a power management unit 59, a micro switch 66, a back-up power module 53 and a device platform receptacle 31, wherein data input/output 90 and power input 80 is supplied through the hub 15. The transceiver 52 may communicate with the micro-processor 51 and further communicate with remote devices through wired data connection 90 and/or wirelessly.

FIGS. 2a, 2b and 2c show the wireport system assembly 1.

FIG. 2a shows the assembly line diagram. The assembly includes the primary conductors 23 extending from one end of the linear conductor/s to the other having a suspension hook/clamp/fastening device 56 at both ends, hubs 15 spaced at repeated increments along the linear conductors and a device platform 24 with a device 55 mounted onto the primary conductor hub. Some devices 55 may have the capability of mounting directly to the hub absent a device platform 24. On at least one end, the primary conductor 23 is connected to at least a power supply 50, a master processor 51, a transceiver 74, a backup power unit 79 and in some assemblies also a mister fluid reservoir/pump 54 with pipe extender/s 45. The assembly can operate using either line voltage or low voltage whereas the conductor's mounted devices can be mounted onto any hub. The line diagram doesn't show a suspension cable 44. The cable is used when the wireport's span is long, causing wire bowing, and/or when the number of devices employed exerts too much weight. FIG. 7 herein shows the device platform 24 having an I-loop to suspend the conductor/s and a device from a cable.

FIG. 2b shows a 3D representation of two wireport assemblies side by side over a space containing furniture below. This depiction illustrates the targeted use of devices 55 only where needed. The devices employed in this representation include a fan assembly 39, a speaker/microphone 40, luminaire assembly 36 and a camera 37. This depiction illustrates that luminaires can be placed only where needed, minimizing energy consumption and visual pollution. FIG. 2c shows a warm eye perspective of the wireport device assembly. The assembly is anchored at both ends by a suspension hook/clamp/fastening device 56 having hubs 15 populated at repeated increments along the primary conductor/s 23, with several devices mounted to the hubs. The devices shown include a speaker/microphone 40, a luminaire assembly 36, a camera assembly 37 and a mister assembly 43. The mister piping system is above the primary conductors 23 and is shown in FIG. 10.

FIGS. 3a, 3b, 3c and 3d show the hub 15. The hub is one of the two key elements of the wireport system. The hub 15 can provide mechanical, electrical and data connectivity to the wireport's wire-suspended device platform 24, devices 55 and assemblies including the device platform 24 and devices 55. The hub 15 is integrated into the primary conductor/s 23 typically spaced at repeating increments and is provided having a top cap 2 and a bottom cap 3 to protect the conductor/s from the elements.

FIG. 3a shows the hub's 15 top view without its top cap 2. In the center of the hub 15 a through opening 8 enables a device platform 24 or device 55 through bolt to pass through and be secured to the hub's top 16. Inside the opening a hub guide groove 18 enables orienting the device platform 23 and/or a directly-mounted device 55 to form a firm and precise mechanical and electrical contact with the device platform and/or device. The hub top 16 may include a gasket 7. The gasket shown in this description is wedged between the hub top 16 and the bottom of the cap 19. FIG. 3b shows a side view of the hub 15 with sections of the primary conductor/s 23 shown on both sides. Not shown in this depiction are the top cap 2 and the bottom cap 3 which accompany the hub 15 when it is not occupied by a device 55 and/or a device platform 23. FIG. 3c shows the hub's 15 bottom view without its bottom cap 13. In the center of the hub 15 a through opening 8 enables a device platform 24 or device 55 through bolt to pass through and be secured to the hub's top 16. Inside the opening, a hub guide groove 18 enables orienting the device platform 23 and/or a directly-mounted device 55 to form a firm and precise mechanical and electrical contact with the device platform and/or the device. Across the opening 8 formed into the insulated hub material are the hub's electrical contact guides 9. Electrical contacts on top of the device platform 24 or on top of a device 55 become electrically engaged when these elements are mechanically secured to the hub 15. Not shown in this depiction is a gasket 7. The gasket is wedged between the bottom of the hub and top of the device platform 24 or device 55 to form an insulated bond. FIG. 3d shows a cross section of the hub 15. Inside the hub, the hub conductor/s 5 are embedded in insulated non-corrosive material permitting electrical connectivity through the hub electrical contact guide 9. At the hub center, the hub through opening 8 extends from the hub's bottom to top having the hub guide groove 18 at its center. At the hub's bottom, the hub's bottom gasket cavity 10 employing a gasket 7 insulates and protects the assembly's electrical components from the elements.

It should be understood that while is depicted in the figures that the hub 15 has a through opening in the center of the hub 15 for coupling a device platform 24 or a device 55, other embodiments are contemplated without departing from the scope of the invention and claims. In some embodiments, the device platform 24 or the device 55 may be coupled to the hub in any manner that provides mechanical connectivity; mechanical and electrical connectivity; or mechanical, electrical and data connectivity.

FIGS. 4a, 4b, 4c, 4d, 4e and 4f show the hub's 15 top cap 2 and bottom cap 3. The caps 2, 3 keep the hub's 15 electrical contact/s 6 protected from the elements when the hub 15 is not occupied by a device platform 24 and/or a device 55. The removable caps are factory-installed and can be reused when a device platform 24 or a directly-mounted device 55 is removed from the hub 15. The caps are made of plastic or other material having similar non-corrosive, fire-retardant, insulating properties.

FIG. 4a shows the top cap 2 top view. At the center of the cap, a top cap hanging I-bolt bore 21 enables suspending the hub 15 from a cable 44 by using a looped I-bolt 35.

FIG. 4b shows the bottom view of the top cap 2. At the center of the cap a cylindrical stem with a threaded bore 22 is configured to mate with the bottom cap 3 threaded bolt 13. Not shown in this depiction is a gasket 7. The gasket shaped O-ring is wedged between the top cap 2 and the hub 15. Upon mating with the bottom cap 3, the gasket 7 is compressed, sealing the connection from moisture penetration.

FIG. 4c shows a side view of the top cap 2. Below the cap's top, a gasket 7 is shown around the top cap stem 11. The top cap stem threaded bore 22 is shown in a dashed line. FIG. 4d shows the bottom cap 3 top view. The bottom cap threaded stem 13 is shown in the center of the cap. Surrounding the threaded stem 13 is a gasket 7. Once the top and bottom caps mate, the gasket 7 seals the hub's bottom 17 from the elements, protecting the hub's electrical conductor/s. FIG. 4e shows the bottom of the bottom cap 3. At the center of it, a screw recess 14 enables screwing the bottom cap 3 into the top cap 2 having the hub 15 wedged in the middle. FIG. 4f shows a side view of the bottom cap 3. An integral threaded bolt 13 is located at the cap's center having an O-ring shaped gasket 7 looped through it. Upon mating the bottom cap 3 with the top cap 2, the gasket 7 is compressed against the hub bottom 17 forming a seal to protect the hub's electrical conductor/s 5 from the elements.

FIGS. 5a, 5b, 5c, 5d, 5e and 5f show the hub 15, the top cap 2 and the bottom cap 3 assembly in sections and perspective views.

FIG. 5a shows the hub's 15 vertical section through its center, perpendicular to the hub's conductor/s 5. The top cap 2 is shown mating the bottom cap 3 with the hub 15 wedged between the two caps. Wedged between both caps and the hub 15 are top and bottom gaskets 7. The hub's conductor/s 5 are shown embedded in the hub's non-corrosive enclosure with the bottom cap 3 gasket 7 pressed against the hub 15 protecting the hub's electrical contact guide from being exposed to the elements.

FIG. 5b shows a vertical section through the center of the hub and caps assembly parallel with the primary conductor/s 23.

FIG. 5c shows a horizontal section through the hub's conductor/s 5. The primary conductor/s 23 can become the hub's conductor/s when passing through the hub 15 or be in contact with conductive surfaces below.

FIG. 5d shows a horizontal section perspective through the hub center having the bottom cap threaded stem 13 protruding from below. One method of fabricating the prime conductor/s 23 and the hub 15 assembly is employing harden hub core material on to which the conductor/s are wrapped around and then pulled through molten insulation material. FIG. 5e shows a top perspective of the hub 15 and top cap 2. Also shown at the center of the top cap 2 is a threaded bore 21. The threaded bore accommodates an I-loop 35 used when the wireport assembly 1 employ a cable to mechanically support its devices 55. FIG. 5f shows a bottom perspective of the hub 15, the top cap 2 and the bottom cap 3. At the bottom center of the top cap 2 a screw recess enables screwing the bottom cap 3 with its threaded stem into the top cap 2.

FIGS. 6a, 6b, 6c, 6d, 6e and 6f show the wireport's detachable device platform 24. The device platform conveys power and data to an array of I.O.T. devices and provides mechanical connectivity to the wireport's hub/s 15. The primary conductor/s 23 span between and anchored by the hub/s 15. The wireport's hubs populate the primary conductor/s 23 at regularly repeated intervals, enabling the placement of I.O.T devices with their device platform 24 where and when needed. The device platform 24 may house components needed to operate its bottom-mounted device. These components may be removable and used only in association with a specific device. However, the device platform architecture is universal aimed at reducing device complexity to enable the device platform to efficiently operate different devices. The device platform's internal devices may include at least one wireless transceiver 42, a micro-processor 51, a backup power unit 53, and a power supply/modulation unit 50. FIG. 1 shows several device platform internal device configurations. The device platform may have a unique address and may be communicated by wireless, wired or a combination of both means. The device platform 24 may communicate with all other networked device platforms, only with selected device platforms or with all network system devices including non-wire suspended devices.

FIG. 6a shows the top view of the device platform 24. At the device platform's 24 top a threaded stem bore 29 is shown at the device platform threaded stem 20 center having the device platform nut 28 threaded to the stem. FIG. 6b shows the top view with the device platform threaded stem 20 nut removed. On both sides of the device platform threaded stem 20 the device platform contact leads 25 are shown extending out from the top face of the device platform 24. At one side of the device platform threaded stem 20 a stem guide 75 locks the stem 20 against rotation when the nut 28 is secured to the hub's top 16. Between the device platform 20 top surface and the hub bottom 17 a gasket 7 protects the assembly's components from the elements. An opening in the gasket 7 enables the electrical contact/s or electrical and data contact/s to engage the corresponding receptacle inside the hub 15.

FIG. 6c shows the device platform bottom opening 32. The recessed device platform opening 32 provides a protective area to mechanically and electrically engage devices to the device platform 24. This depiction shows a standard industry receptacle for a GU base lamp holder 31. The receptacle may be employed by a number of other devices not related to lighting. In addition, the receptacle can be removable and adapted to receive other receptacle types capable of conveying electrical and/or non-electrical power and/or data. FIG. 6d shows an elevation of the device platform 24 and the hub 15 assembly in perpendicular view to the primary conductor 23 axis. The depiction shows the hub in a dashed line exposing the device platform contact leads 25 having the device platform threaded stem 20 secure the assembly to the hub 15 by means of a nut 28.

FIG. 6e shows the elevation of FIG. 6d rotated at 90° to its vertical axis. This depiction shows the primary conductor/s at both sides of the hub 15 and the device platform threaded stem 20 at the assembly vertical center.

FIG. 6f is a section view taken vertically at the center of the device platform 24. The elements shown in this depiction include the device platform opening 32 recess at its bottom, a device platform internal devices cavity 19, a gasket 7 at the hub's 15 top and bottom surface, a threaded stem bore 29 to hang the assembly from a cable 44 when needed, and a nut 28 securing the device platform 24 to the hub 15. The tighter the nut is to the hub 15, the better secured the internal assembly components are from the elements.

Figure 7A:
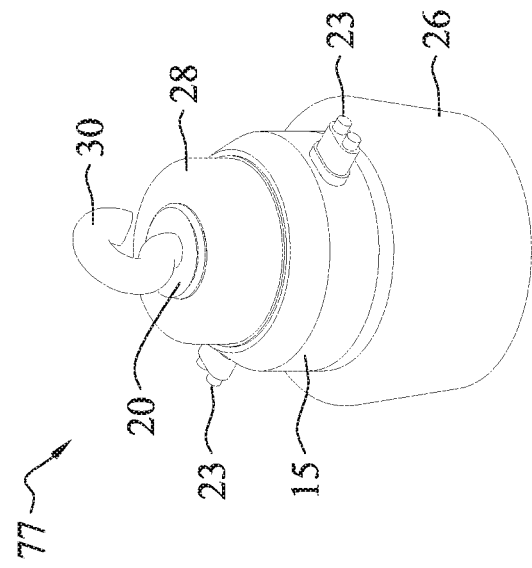
FIG. 7A is a top perspective view of a device assembly according to an embodiment.

FIGS. 7a and 7b show top and bottom perspectives of the device platform 24 assembly with a hub 15 assembly 77. FIG. 7a shows the platform's top view. At the top of both FIGS. 7a and 7b, an I-loop 35 is shown threaded into the device platform threaded stem 20. The loop is used to suspend the wireport assembly from a cable 44 when the wireport span is long and/or heavy.

FIGS. 8a, 8b and 8c show a vertical section through the device platform 24 assembly 78 center.

FIG. 8a and FIG. 8b are views of the same assembly whereas FIG. 8b is rotated at 90° along its vertical axis. Both FIG. 8a and FIG. 8b show an I-loop 30 bolted onto the device platform stem bore 29. Connected to the device platform 24 from below is lamp 33 having a standard industry lamp base.

FIG. 8c shows the same assembly as FIG. 8a and FIG. 8b absent the I-loop 30. Short span wireport assembly may not require a support cable. Also, some short span wireports may have support cables embedded in the primary conductor/s 23 wire and/or the primary conductor/s coating may have sufficient structural strength to support the wireport assembly 1.

FIGS. 9a, 9b, 9c, 9d, 9e and 9f show several examples of the device platform 24 devices.

FIG. 9a shows a camera 37. The camera 37 can be supported by analytics and may not require visible light to observe, record or transmit imagery. The camera 37 image transmission can be in real time or delayed by wireless and/or wired means. The camera 37 can operate independently or in concert with other wireport network devices, including network members not physically connected to the wireport's primary conductor/s hung devices. FIG. 9b shows a speaker/mic 40. The speaker/mic 40 can transmit sound, or transmit sound and record sound. FIG. 9c shows a wireless transceiver 52. The transceiver can receive/transmit data between wireport devices, Between wireport devices and remote location/s and the wireport devices, and other local devices having permission to join the network. The transceiver can relay instructions between the wireport's master processor with controller to the network devices and transmit back or to remote location/s input from the network devices. This input may include alerting when a device experiences anomalies. FIG. 9d shows an occupancy sensor 38. The occupancy sensor 38 senses activity below and can transmit an instruction to network members to turn on. The occupancy sensor may be coupled with a photocell turning on lighting devices when light levels fall below a set threshold. The occupancy sensor 38 may have switching capability directly or indirectly to activate network devices. FIG. 9e shows a fan 39 forcing air in a narrow cone downwardly. The fan may be coupled with an air quality/temperature sensor assembly 41 or such an assembly can be mounted to the wireport assembly 1 as a standalone device. The fan can be switched on/off wirelessly and may have an occupancy sensor built in. FIG. 9f shows a lamp 33 assembly. The wireport may employ a variety of lamps types where and when needed. FIG. 2 shows the wireport assembly 1 employing lamps having targeted field of illumination. The lamp's light source can be incandescent, LED, OLED or any other source compatible with the premises' needs. The light distribution pattern may be spherical or cone shaped having a downwardly direction where the cone may be narrow or wide. The wireport assembly 1 may employ several lamps having different features on the same wired span and also may change the lamp types through the year or seasonally. The lamps employed may have in-built wireless connectivity, having adjustable optical focus and/or aiming ability.

Figure 10A:
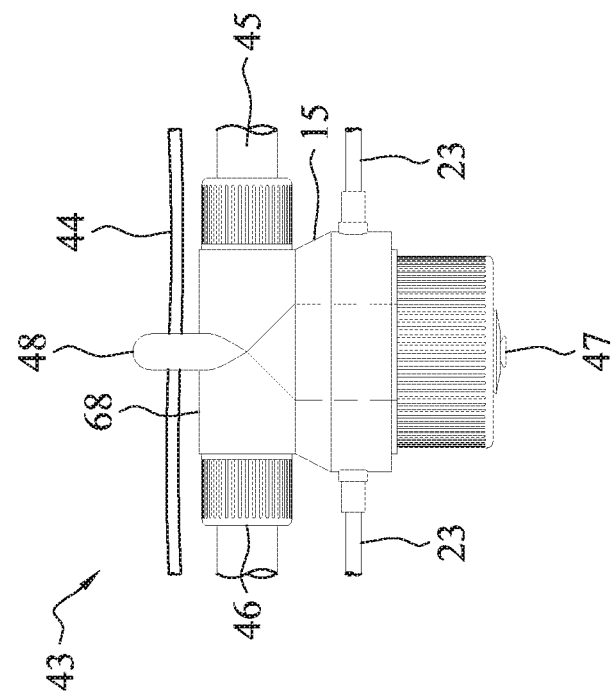
FIG. 10A is an exploded view of a wireport assembly with misters according to an embodiment.
Figure 10B:
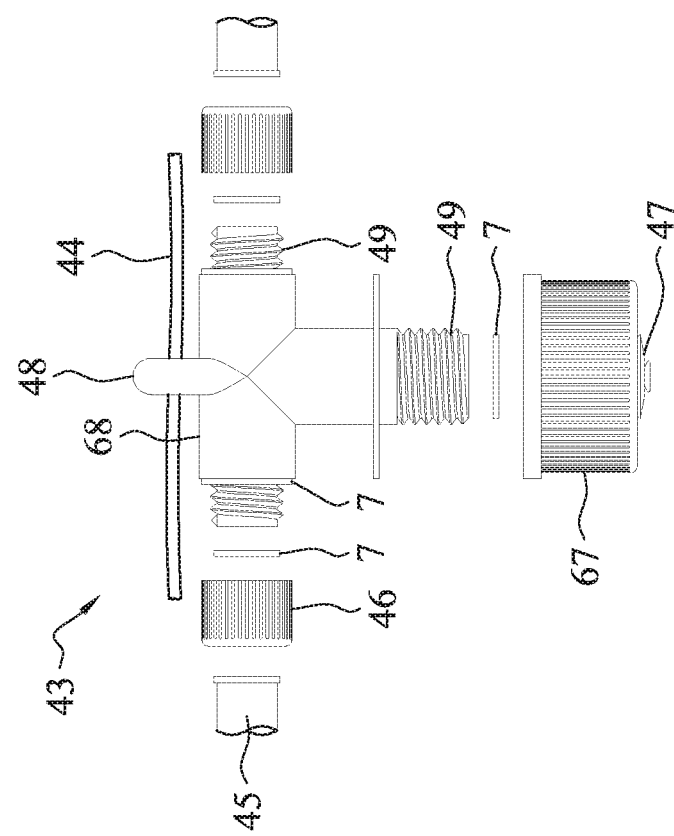
FIG. 10B is a side view of a wireport assembly with misters according to an embodiment.

FIGS. 10a and 10b show a mister assembly 43.

FIG. 10a shows the mister assembly components in exploded view and FIG. 10b shows the same components assembled. The mister assembly 43 components include the mister body 68, the mister hanger 48, coupling 46, spray nozzle coupling 67, spray nozzle 47, and gasket 7. The mister assembly connects to the primary conductor/s 23 hub 15 by inserting the mister assembly 43 body 68 stem through the hub 15 and securing it by tightening the spray nozzle coupling 67 against the hub bottom 17. The mister assembly 43 is hung from a cable 44 which is threaded through the mister hanger 48. Pressurized fluid is delivered to the mister body 68 and travels downstream through the mister's pipe extenders 45. The pipe extender sections are modular and based on the wireport's hubs spacing modularity. The pipe extender 45 connects to the mister body by threading a coupler 46 onto the threaded mister body 68 "T's" having gaskets 7.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims.

The invention claimed is:

1. A removable device platform comprising:
    a mechanical receptacle adapted to mechanically connect to a device and a hub embedded in a suspended wire, the hub integrated with a linear conductor, the mechanical receptacle to convey power or power and data from the linear conductor to the device; and
    at least one of a hub power receptacle, a device power receptacle, a wireless transceiver, a back-up power unit, a processor, a micro-switch, a spray nozzle, and a power supply/modulation unit, wherein the mechanical receptacle is configured to engage mechanically and electrically the device, wherein the device platform is configured to engage one of an electrified device and a non-electrified device, and wherein the device platform optimizes its operation in response to processing past recorded activity and executing a self-teaching program to improve utility of the device coupled to the device platform.

2. The device platform of claim 1, further comprising a hook for mechanically suspending the linear conductor from a mechanical support cable.

3. The device platform of claim 1, wherein the mechanical receptacle, an electrical receptacle and a data receptacle of the hub are each universal.

4. The device platform of claim 1, wherein the device is more than one device, and wherein the more than one device are equivalent devices or different devices.

5. The device platform of claim 1, wherein the device platform comprises a wireless transceiver with a processor having a discrete address.

6. The device platform of claim 1, wherein the device platform responds to environmental changes in response to the processor processing sensory input, received by a device coupled to the device platform, a neighboring device, or combinations thereof, in accordance with program parameters and instructions stored locally or received from a remote location, wherein the response of the device platform is predictable, consistent and logical.

* * * * *